US006825692B1

United States Patent
Chung et al.

(10) Patent No.: US 6,825,692 B1
(45) Date of Patent: Nov. 30, 2004

(54) INPUT BUFFER FOR MULTIPLE DIFFERENTIAL I/O STANDARDS

(75) Inventors: Jonathan Chung, Newark, CA (US); In Whan Kim, San Jose, CA (US); Philip Pan, Freemont, CA (US); Chiakang Sung, Milpitas, CA (US); Bonnie Wang, Cupertino, CA (US); Xiaobao Wang, Santa Clara, CA (US); Yan Chong, Stanford, CA (US); Gopinath Rangan, Santa Clara, CA (US); Khai Nguyen, San Jose, CA (US); Tzung-Chin Chang, San Jose, CA (US); Joseph Huang, San Jose, CA (US)

(73) Assignee: Altera Corporation, San Jose, CA (US)

( * ) Notice: Subject to any disclaimer, the term of this patent is extended or adjusted under 35 U.S.C. 154(b) by 10 days.

(21) Appl. No.: 10/056,367

(22) Filed: Jan. 25, 2002

(51) Int. Cl.[7] ............... H03K 19/0175; H03K 19/094
(52) U.S. Cl. .................... 326/68; 326/83; 327/408
(58) Field of Search .................... 326/57, 58, 68, 326/81, 83; 327/407, 408

(56) References Cited

U.S. PATENT DOCUMENTS

| 6,020,761 | A | * | 2/2000 | Hwang et al. ............... 326/80 |
| 6,023,175 | A | * | 2/2000 | Nunomiya et al. ........... 326/68 |
| 6,064,226 | A | * | 5/2000 | Earl ............................ 326/68 |
| 6,236,231 | B1 | | 5/2001 | Nguyen et al. ............... 326/39 |

* cited by examiner

Primary Examiner—Daniel D. Chang
(74) Attorney, Agent, or Firm—Morgan Lewis & Bockius LLP

(57) ABSTRACT

An input buffer circuit has a plurality of selectively enabled differential amplifier circuits, where each differential amplifier is configured for compatibility with a particular differential I/O standard and its corresponding input operating range. For example, the input buffer may have two differential amplifiers suitable for receiving LVDS differential input signals over a wide input operating range, and another differential amplifier suitable for receiving the PCML differential input signals. One or more control signals are provided to the input buffer, e.g., programmably, to selectively enable the required differential amplifier(s) for a given I/O standard.

25 Claims, 5 Drawing Sheets

US 6,825,692 B1

INPUT BUFFER FOR MULTIPLE DIFFERENTIAL I/O STANDARDS

FIELD OF INVENTION

The present invention relates generally to the fields of digital circuitry and electronics. More particularly, it relates to an input buffer circuit suitable for receiving signals in accordance with multiple differential I/O standards having different input operating ranges—e.g., the LVDS standard and another differential standard such as CML or PCML.

BACKGROUND OF THE INVENTION

Digital electronic systems are commonly implemented by combining and interconnecting several different integrated circuit (IC) devices such as processors, memory devices and programmable logic devices. The various IC devices communicate with one another by way of input and output (I/O) signals transmitted over a system bus, and several different I/O standards exist for this purpose. One prevalent I/O standard is Low Voltage Differential Signaling (LVDS). LVDS is a low noise, low power, and high-speed I/O interface that uses differential signals without a reference voltage and therefore requires two signal lines for each signal channel. The voltage difference between the two signal lines defines the logic state of the LVDS signal.

Generally, an LVDS output driver in a transmitting device converts a single-ended digital logic signal—e.g., a CMOS (Complementary Metal Oxide Semiconductor) or TTL (Transistor—Transistor Logic) logic level signal—into the LVDS differential format. The differential signal generated by an LVDS output driver has a typical voltage swing of about 350 mV and a typical common-mode voltage of about 1.2 V on the two LVDS signal lines. The small voltage swing in the LVDS signal makes the standard well-suited for high-speed data transmission. From the output driver, the LVDS signals are transmitted to another device having an LVDS receiver for converting the differential signal back into a desired single-ended logic signal format. The LVDS receiver includes an input buffer circuit powered by an I/O supply voltage VCC. The VCC I/O supply typically equals 3.3 V, however the voltage swing in the LVDS standard is not dependent on power supply levels. Generally, the LVDS receiver must be able to tolerate a±1 V shift between the ground reference of the output driver and the receiver ground. Therefore, where the LVDS signal provided by an output driver swings from 1.0–1.4 V, the LVDS input buffer must be able to operate properly with input voltage swings that range from 0.0–0.4 V in the case of a –1 V ground shift, to 2.0–2.4 V for a+1 V ground shift. Therefore, the LVDS input buffer has an input operating range from 0.0–2.4 V.

Since many differential I/O standards, including LVDS, are commonly used in digital systems, it is advantageous if an input buffer circuit is compatible with and able to support multiple differential I/O standards. In particular, it is often desirable for the input buffer circuit of an LVDS receiver to be able to properly receive and process signals formatted according to other differential I/O standards. However, for some other differential I/O standards, such as the CML (current mode logic) and PCML (pseudo current mode logic) standards, the input operating range is designed to be at or near the VCC voltage level. For example, in the CML standard, the input voltage may swing from 0.6 V below VCC to VCC. Where VCC=3.3. V, the CML input operating range is from 2.7–3.3 V. Unfortunately, however, the differential amplifier circuitry in existing LVDS input buffer circuits generally does not respond well to input voltages that are higher than 2.4 V and therefore outside the LVDS operating range.

Consequently, there is a need for an input buffer circuit that is compatible with differential input signals for different digital I/O standards, even when the input voltage operating ranges for the different standards vary. In addition, there is a more specific need for an input buffer circuit that fully supports both LVDS and other differential I/O standard signals such as CML and PCML signals. Furthermore, it would be especially desirable to provide an input buffer circuit, originally designed for one I/O standard, that is readily adapted to support other I/O signal standards while still using a significant part of the original input buffer circuitry.

SUMMARY OF THE INVENTION

The present invention provides an input buffer circuit having a plurality of selectively enabled differential amplifier circuits, where each differential amplifier is configured for compatibility with a particular differential I/O standard and its corresponding input operating range. By selectively enabling, in a given input buffer mode, only the differential amplifier circuit(s) configured for a specific input signal standard, the input buffer provides considerable flexibility in interfacing between digital devices using a variety of differential I/O standards. If the input operating range for an I/O standard is large—as is the case for LVDS and LVPECL—two or more differential amplifier circuits can be used to provide amplification in different portions of the input operating range. The selective enabling/disabling of differential amplifier circuits may be performed by one or more programmable control signals. By sharing current source and other input buffer circuitry in each differential I/O standard operating mode, unnecessary duplication of circuit functions in the input buffer is also avoided.

In one embodiment, the invention provides an input buffer circuit having first and second differential input terminals for receiving first and second input signals respectively. The difference between the input signals provides a differential input signal. A first differential amplifier circuit has a first input coupled to the first differential input terminal and a second input coupled to the second differential input terminal. The first differential amplifier circuit is configured to generate a first logic level signal at an output node when the differential input is provided in accordance with a first digital I/O standard. Similarly, a second differential amplifier circuit has a first input coupled to the first differential input terminal and a second input coupled to the second differential input terminal. The second differential amplifier circuit is configured to generate a second logic level signal at the output node when the differential input is provided in accordance with a second digital I/O standard. To selectively enabling the first differential amplifier circuit in a first input buffer mode, a first set of one or more switch circuits coupled to the first differential amplifier circuit may be used. To selectively enabling the second differential amplifier circuit in a second input buffer mode, a second set of one or more switch circuits coupled to the second differential amplifier circuit may be used.

Where the first digital I/O standard has a wide input operating range, the first differential amplifier circuit may be configured to generate the first logic level signal at the output node when the differential input is provided in accordance with the first digital I/O standard and a common mode component of the input signals is in a first, e.g., upper, portion of the input operating range. In this case the input buffer circuit may also include a third differential amplifier circuit having a first input coupled to the first differential input terminal and a second input coupled to the second differential input terminal. The third differential amplifier circuit is configured to generate the first logic level signal at the output node when the differential input is provided in accordance with the first digital I/O standard and the common mode component of the input signals is in a second, e.g., lower, portion of the first I/O standard's input operating range. Here, a third set of one or more switch circuits coupled to the third differential amplifier circuit may be used to selectively enable the third differential amplifier circuit in the first input buffer mode.

BRIEF DESCRIPTION OF THE DRAWINGS

The objects and advantages of the present invention will be better understood and more readily apparent when considered in conjunction with the following detailed description and accompanying drawings which illustrate, by way of example, embodiments of the invention and in which.

DETAILED DESCRIPTION OF PREFERRED EMBODIMENTS

Figure 1A:
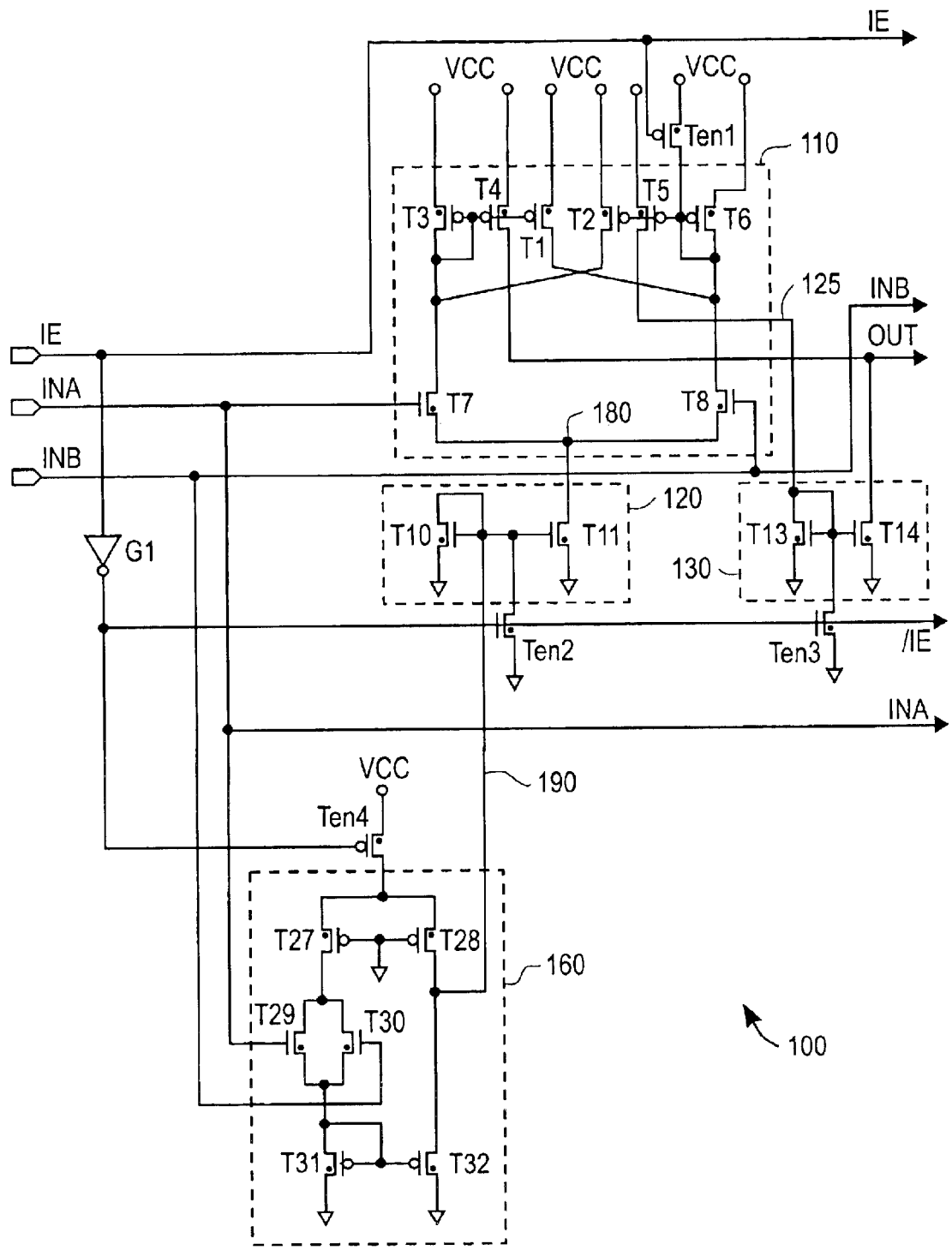
FIGS. 1A and 1B are circuit diagrams of an LVDS input buffer circuit.
Figure 1B:
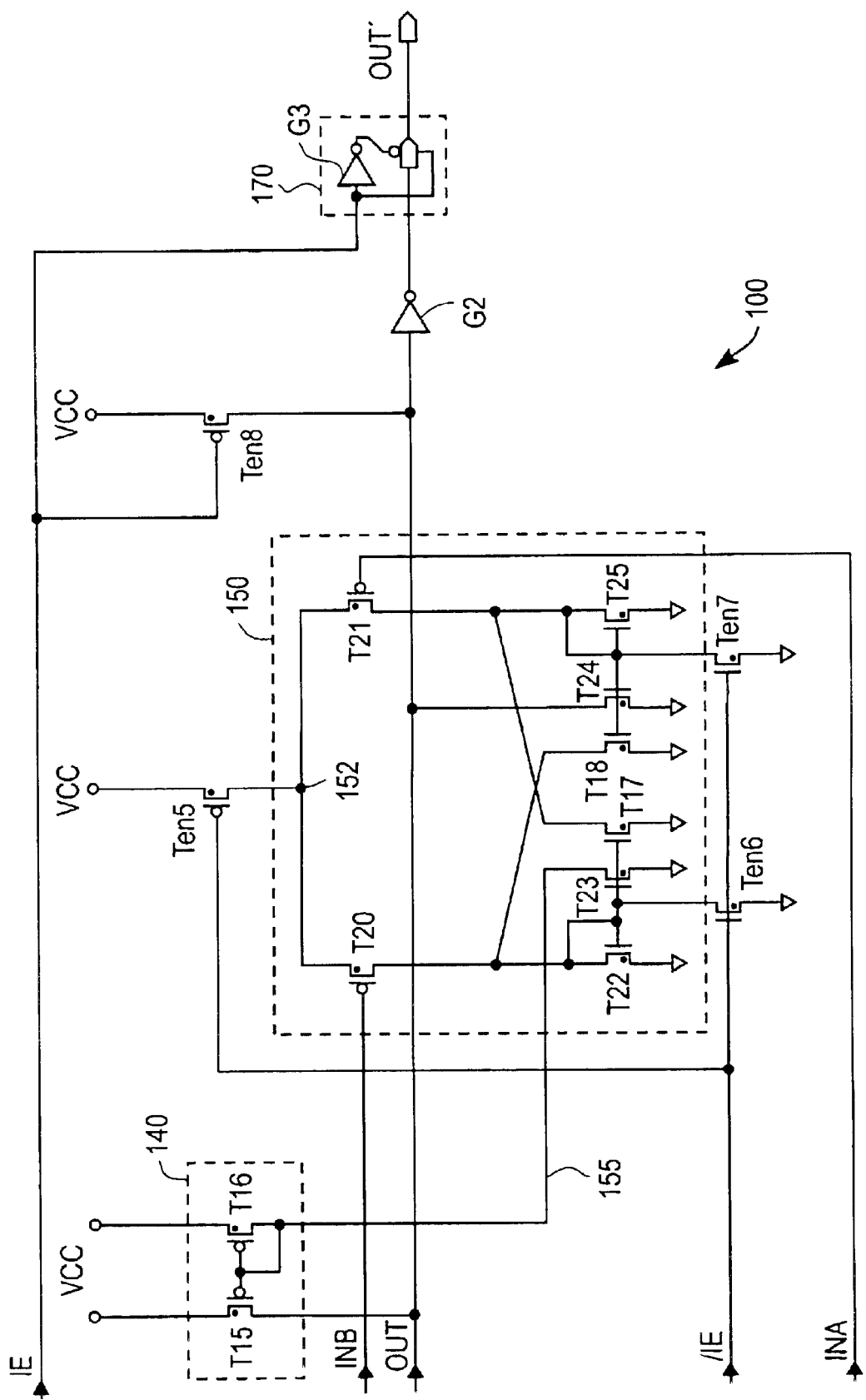

FIGS. 1A and 1B are circuit diagrams that together show an LVDS input buffer circuit 100. Input buffer circuit 100 is similar to that described in U.S. Pat. No. 6,236,231, the contents of which are incorporated herein in their entirety.

Referring to FIGS. 1A and 1B, input buffer 100 includes a first LVDS differential amplifier circuit 110, a current mirror biasing circuit 120, a pull-down current mirror circuit 130, a pull-up current mirror circuit 140, a second LVDS differential amplifier circuit 150, a current source circuit 160, and a transmission gate circuit 170. Input buffer 100 has a first input terminal for receiving a first input signal INA and a second input terminal for receiving a second input signal INB. The difference in the INA and INB signals provides a differential LVDS input. The INA and INB signals are provided to first differential amplifier circuit 110, second differential amplifier circuit 150, and current source circuit 160. A differential impedance of 100 (not shown) is typically connected between the differential inputs of the receiver to sink DC current in the received LVDS signal.

Buffer circuit 100 also receives an input enable signal IE that is inverted at an inverter G1 to provide the signal /IE. The IE and /IE signals are provided to a number of switch circuits to selectively enable/disable the various circuit components of buffer 100. More particularly, the switch circuits are implemented using enabling transistors that receive the IE or /IE signal, as described below.

Input buffer circuit 100 includes both n-channel and p-channel metal oxide semiconductor (NMOS and PMOS) field effect transistors and is typically formed as an integrated circuit on a common substrate. In addition to gate, source and drain terminals, each MOS transistor typically also has a body terminal (not shown for the transistors in FIG. 1) for connecting the channel of the transistor to a desired potential. The body terminals of NMOS transistors are generally connected to the most negative supply in the device (receiver ground in circuit 100), while the body terminals of PMOS transistors are generally connected to the most positive voltage in the device or in a specific part of the device (the I/O supply voltage VCC in circuit 100). As described below, an important characteristic of several of the MOSFET transistors in input buffer 100 is the transistor conductivity. Generally, the conductivity of a MOSFET transistor is directly proportional to the width-to-length (W/L) ratio of the channel formed underneath the gate terminal, where the length of the channel is generally the distance between the source and the drain of the transistor.

As described below, amplifier circuits 110 and 150 are designed to receive differential input signals in accordance with the LVDS standard, in particular its input operating range and voltage swing, and convert them into single-ended CMOS logic signals. When used with other differential I/O standards, the design parameters of a differential amplifier circuit, e.g., the transistor conductivities and bias current supplied, may change. In addition, only one differential amplifier circuit is typically required for standards with smaller input operating ranges. Furthermore, although the design of LVDS buffer circuit 100 is based on complementary metal oxide semiconductor (CMOS) technology, those skilled in the art will appreciate that similar input buffer circuits for LVDS and other differential standards may be implemented using other design technologies, including bipolar transistor technologies such as TTL.

Referring now to FIG. 1A, differential amplifier circuit 110 includes a differential pair of matched NMOS transistors T7 and T8 with an active current mirror load circuit formed by PMOS transistors T1, T2, T3, T4, T5, and T6. The gate (i.e., the control terminal) of transistor T7 receives the INA input signal, and the gate of transistor T8 receives the INB input signal. Transistors T7 and T8 have thick oxide layers as is commonly the case for MOS transistors that receive input signals in an integrated circuit device. The source terminals of transistors T1, T2, T3, T4, T5, and T6 are each connected to the an I/O power supply voltage VCC. The gate terminals of transistors T1, T3, and T4 are each connected to the drain terminal of transistor T7, while the gate terminals of transistors T2, T5, and T6 are each connected to the drain of transistor T8. The drain terminals of transistors T2 and T3 are also connected to the drain terminal of transistor T7, and the drain terminals of transistors T1 and T6 are connected to the drain of transistor T8. The node for an output signal OUT is provided at the drain of transistor T4 as shown, and a complementary output node 125 is provided at the drain of transistor T5. A switch circuit used to enable circuit 110 is formed by PMOS transistor Ten1, which receives the IE signal at its gate. The source of Ten1 is connected to VCC and the drain of transistor Ten1 is connected to the drain of transistor T8 and the gates of transistors T2, T5, and T6.

The source terminals of differential transistors T7 and T8 in circuit 110 are connected together at a node 180 which is biased by current mirror biasing circuit 120. Biasing circuit 120 includes NMOS transistors T10 and T11 which have their sources connected to the receiver ground—the most negative supply reference in buffer circuit 100. The drain of transistor T11 in circuit 120 is connected to node 180, while the gates of both transistors T10 and T11 are connected to the drain of transistor T10 and also to an output 190 of current source circuit 160. As described below, circuit 160 generates an appropriate reference current out of node 190 for biasing amplifier circuit 110. A switch circuit formed by an NMOS transistor Ten2 is used to enable biasing circuit 120, and together with transistor T11 effectively enables amplifier 110 as well. Transistor Ten2 has its source connected to receiver ground and its drain connected to the gates of T10 and T11. The gate terminal of transistor Ten2 receives the inverted input buffer enable signal /IE.

Referring still to FIG. 1A, a pull-down current mirror circuit 130 for amplifier 110 includes two NMOS transistors T13 and T14. The sources of transistors T13 and T14 are connected to receiver ground. The drain of transistor T13 is connected to node 125 and to the gates of both T13 and T14. The drain of transistor T14 is connected to the OUT signal node. Another switch circuit formed by NMOS enable transistor Ten3 is connected to circuit 130. The source of Ten3 is connected to receiver ground, the drain of Ten3 is connected to node 125, and its gate receives the /IE signal.

Referring now to FIG. 1B, the second differential amplifier circuit 150 includes a differential pair of matched PMOS transistors T20 and T21 with an active current mirror load circuit formed by NMOS transistors T17, T18, T22, T23, T24, and T25. The gate of transistor T20 receives the NB input signal, and the gate of transistor T21 receives the INA input signal. As input transistors, transistors T20 and T21 typically have thick oxide layers. The source terminals of transistors T17, T18, T22, T23, T24, and T25 are each connected to receiver ground. The gate terminals of transistors T17, T22, and T23 are each connected to the drain terminal of transistor T20, while the gate terminals of transistors T18, T24, and T25 are each connected to the drain of transistor T21. The drain terminals of transistors T18 and T22 are also each connected to the drain of transistor T20, and the drain terminals of transistors T17 and T25 are also each connected to the drain of transistor T21. The drain of transistor T23 is connected to a node 155, and the drain of transistor T24 is connected to the OUT signal node. A switch circuit for enabling differential amplifier circuit 150 includes a PMOS transistor Ten5 having its source connected to VCC and its drain connected to the sources of both transistors T20 and T21 at a node 152. Transistor Ten5 receives the /IE signal at its gate, and also acts as a bias current source for amplifier 150 when enabled. Two additional enabling NMOS transistors Ten6 and Ten7 receive the /IE signal at their respective gate terminals to form additional enabling switch circuits for amplifier 150. The source terminals of Ten6 and Ten7 are connected to receiver ground, the drain of Ten6 is connected to the drain of transistor T20, and the drain of Ten7 is connected to the drain of transistor T21.

Pull-up current mirror circuit 140, which is also shown in FIG. 1B and operates in conjunction with amplifier 150, includes two PMOS transistors T15 and T16. The sources of transistors T15 and T16 are connected to VCC. The drain of transistor T16 is connected to node 155 and to the gates of both T15 and T16. The drain of transistor T15 is connected to the OUT signal node.

Referring back to FIG. 1A, current source circuit 160 includes a pair of matched NMOS transistors T29 and T30 that receive the INA and INB input signals at their respective gate terminals. Transistors T29 and T30 again may have thick oxide layers. The sources of transistors T29 and T30 are connected together and also to a current mirror formed by two NMOS transistors T31 and T32. The gates of transistors T31 and T32 are connected to the drain of transistor T31 and to the sources of transistors T29 and T30. The source terminals of transistors T31 and T32 are connected to receiver ground. The drain terminals of transistors T29 and T30 are also tied together and connected to the drain terminal of a PMOS transistor T27 whose gate terminal is tied to receiver ground. The source terminal of transistor T27 is connected to the source terminal of another PMOS transistor T29 that also has its gate tied to receiver ground. The drain of transistor T28 is connected to the drain of transistor T32 to provide the output node 190 of current source circuit 160. The sources of transistors T27 and T28 are further connected to the drain of an enabling PMOS transistor Ten4 which provides a switch circuit for enabling current source 160. The source of transistor Ten4 is connected to VCC and the gate of Ten4 receives the signal /IE.

Referring again to FIG. 1B, the OUT signal is provided via an inverter G2 to the transmission gate circuit 170 enabled by IE and its complement /IE obtained from another inverter G3. Circuit 170 is a CMOS transmission gate with an NMOS transistor (not shown) gated by the IE signal in parallel with a PMOS transistor (also not shown) gated by /IE. The output of transmission gate circuit 170 is the output OUT' of buffer 100, where OUT' is generally an inverted version of OUT. A further enabling switch circuit is formed by PMOS transistor Ten8 having its source connected to VCC and its drain connected to the OUT node. The gate of transistor Ten8 receives the IE signal.

Assuming the IE signal is high, LVDS input buffer circuit 100 operates as follows. As described above, the LVDS input signal between signals INA and INB has a typical voltage swing of about 350 mV and a typical common-mode voltage, i.e., (INA+INB)/2, of about 1.2 V as transmitted by an LVDS output driver. Input buffer 100 is designed to tolerate a±1 V shift between the ground reference of the output driver and the receiver ground, and therefore buffer 100 supports an input operating range from 0 V (receiver ground) to +2.4 V (i.e., buffer 100 supports an LVDS input saving from 0.0–0.4 V to 2.0–2.4 V).

When the common-mode component of the LVDS input places INA and INB in an upper part of the input operating range, NMOS transistors T7 and T8 in differential amplifier circuit 110 turn on and conduct since their gate-to-source voltages are greater than the threshold voltages of T7 and T8. The intrinsic threshold voltages of transistors T7 and T8 may be approximately 0.4 V, but their actual turn-on threshold voltage rises when the body biasing effect (which depends on how much the voltage at node 180 is above receiver ground) is taken into consideration. In addition, when the inputs INA and INB are in the upper part of the operating range, PMOS transistors T20 and T21 in differential amplifier circuit 150 are off since their source-to-gate voltages are less than the magnitude of the threshold turn-on voltage for those transistors. (Note that the source terminals of transistors T20 and T21 will be at approximately VCC since IE is high and therefore Ten5 is on.). The intrinsic threshold voltage magnitude of transistors T20 and T21 may be about 0.3 V, but again the actual transistor turn-on voltage is higher due to the body biasing effect.

On the other hand, when the common mode component of the INA and INB signals is in a lower part of the input operating range, NMOS transistors T7 and T8 in differential amplifier circuit 110 are off since their gate voltages are not sufficiently high to turn T7 and T8 on. In this case, however, PMOS transistors T20 and T21 in circuit 150 turn on since the source-to-gate voltages of T20 and T21 now exceed the magnitude of their threshold voltages. If the common mode component of the INA and INB signals is in a middle region of the operating range that is neither high enough to turn transistors T20 and T21 off nor low enough to turn transistors T7 and T8 off, both sets of transistors conduct.

When transistors T7 and T8 in differential amplifier circuit 110 are on, they are biased at node 180 by a sink current generated by transistor T11 in current mirror biasing circuit 120. The magnitude of that current is determined by the reference current output by circuit 160 at node 190, as described in more detail below. If INA>INB, transistor T7 conducts more current than transistor T8. In the load circuit of differential amplifier circuit 10, transistors T3 and T2 are arranged in a current mirror configuration, and so are transistors T1 and T6. A current mirror is formed where the sources of two matched MOS transistors are tied together and their gates are both connected to the drain of one of the transistors, resulting in the current at one drain being mirrored at the other drain. Where the MOS transistors in a mirror circuit have the same channel width to channel length (W/L) ratio, the drain currents of each transistor are generally equal. On the other hand, where one transistor in the mirror circuit has a greater W/L ratio than the other, the drain current in the transistor with the larger W/L ratio is larger by an amount proportional to the relative W/L ratios of the two transistors. Instead of basic two-transistor current mirror circuits, other types of current mirror circuits such as the cascode, Wilson, and modified Wilson current mirrors, may also be used.

In circuit 10, transistor T1 generally has a greater W/L ratio than transistor T3, and similarly transistor T2 generally has a greater W/L ratio than transistor T6. As a result, the drain current of T1 is proportionally greater than the drain current of T3, and the drain current of T2 is proportionally greater than the drain current of T6. As will be apparent from FIG. 1A, the drain current of transistor T7 equals the sum of the drain currents of T2 and T3, and the drain current of transistor T8 equals the sum of the drain currents of T1 and T6. Thus, when INA>INB and transistor T7 conducts more current than transistor T8, the drain current of transistor T6 is larger than the drain current of transistor T3, and the drain current of transistor T2 is larger than the drain current of transistor T1. As a result, the voltage at the drain of transistor T7 is pulled higher via transistor T2 than the voltage at the drain of transistor T8 via transistor T1.

In addition, transistors T3 and T4 are also arranged in a current mirror configuration, as are transistors T5 and T6. Transistor T4 may have a greater W/L ratio than transistor T3, and similarly transistor T5 may also have a greater W/L ratio than transistor T6. Due to the resulting current mirror effects and the higher voltage at the gate of transistor T4 than at the gate of transistor T5, transistor T5 also has a larger drain current than transistor T4 since T4 and T5 are matched. This causes the voltage at complementary node 125 to be pulled high via transistor T5. At the same time, due to the current mirror effect of transistors T13 and T14 in circuit 130, the current through transistor T14 is also larger than the current through transistor T4, and therefore the OUT voltage is pulled low toward receiver ground (i.e., in the opposite direction to node 125).

When INB>INA, transistor T8 conducts more current than transistor T7, the drain current of transistor T3 is larger than the drain current of transistor T6, and the drain current of transistor T1 is now larger than the drain current of transistor T2. Thus, in this case, the voltage at the drain of transistor T7 is pulled higher than the voltage at the drain of transistor T7, and transistor T4 has a larger drain current than transistor T5. Since transistor T4 now conducts more current than transistor T14 in circuit 130, under these conditions OUT is pulled high by transistor T4 towards VCC.

As noted above, current source circuit 160 provides a reference current out of node 190 to current mirror circuit 120, and that reference current is then converted by circuit 120 into a bias current for differential amplifier circuit 110. Referring to FIG. 1A, since the gate of PMOS transistor T27 is tied low, the drain terminals of transistors T29 and T30 are pulled high toward VCC via T27. The gate of PMOS transistor T28 is also tied low, and therefore transistor T28 conducts a current into output node 190 when current source 160 is enabled. When the common mode voltage of INA and INB is in the upper portion of the LVDS input range, both NMOS transistors T29 and T30 conduct since their gate-to-source voltages are greater than their respective threshold voltages. The intrinsic threshold voltage of T29 and T30 may be 0.4 V, but again the body biasing effect, which depends on the voltage at the source terminals of these transistors, will raise the actual turn-on voltage. As a result, transistors T29 and T30 source a current into the drain of transistor T31. Since transistor T31 forms a current mirror with transistor T32, a proportional current is generated at the drain of transistor T32, which thereby acts to sink current out of node 190. PMOS transistor T28, which operates in its saturation region, generally has a higher conductivity than NMOS transistor T32. As will be appreciated, since the conductivity of a PMOS transistor for a given W/L is roughly half that of an NMOS transistor with the same W/L, the W/L ratio of T28 is more than twice the W/L ratio of T32 in this case. Transistor T32 may also have a smaller W/L ratio than transistor In view of the above, the reference current output at node 190 by current source 160 is effectively equal to the drain current of transistor T28 less the drain current of transistor T32. As the common mode voltage of the INA and INB signals lowers, transistors T29 and T30 conduct to a lesser degree and eventually turn off when their threshold voltages are no longer exceeded. Therefore, the drain current of transistor T32 also decreases as the common mode input voltage lowers and, when transistors T29 and T30 turn off, the drain current of T32 becomes very small. Thus, for lower common-mode inputs, the reference current out of node 190 increases until it reaches a maximum value roughly equal to the drain current of transistor T32 once transistors T29 and T30 shut off.

As shown in FIG. 1A, the reference current output by current source 160 is provided to the drain of transistor T10 in current mirror bias circuit 120. That current is then mirrored in the drain of transistor T11 to provide the bias current to amplifier 110. Transistor T11 generally has a relatively large W/L ratio compared to transistor T10 to better enable T11 to sink a sufficiently large bias current out of node 180.

The operation of differential amplifier circuit 150 and corresponding pull-up circuit 140 is analogous to that given above for amplifier circuit 110 and pull-down circuit 130, except amplifier 150 includes a PMOS differential pair and an NMOS current mirror load. In the load circuit of differential amplifier 150, transistors T22 and T17 are arranged in a current mirror configuration, and so are transistors T25 and T18. Transistor T17 generally has a greater W/L ratio than transistor T22, and similarly transistor T18 generally has a greater W/L ratio than transistor T25. Furthermore, transistors T22 and T23 as well as transistors T25 and T24 are also arranged in current mirror configurations. Transistor T23 has a greater W/L ratio than transistor T22, and similarly transistor T24 also has a greater W/L ratio than transistor T25. Transistors T23 and T24 are matched.

When transistors T20 and T21 in differential amplifier circuit 150 are on, the current conducted by transistor Ten5 (which is on assuming IE is high) is fed into node 152, where the source terminals of T20 and T21 are connected. Transistor Ten5 thus acts as a current source and bias circuit for amplifier 150 and generally has a large enough W/L ratio so that a sufficiently large source current is provided into node 152. When INA>INB, transistor T21 conducts more current than transistor T20, the drain current of transistor T22 is larger than the drain current of transistor T25, and the drain current of transistor T17 is larger than the drain current of transistor T18. As a result, the voltage at the drain of transistor T21 is pulled lower via transistor T17 than the voltage at the drain of transistor T20 via transistor T18. Due to the current mirror configurations and the higher voltage at the gate of transistor T23 than at the gate of transistor T24, transistor T23 also has a larger drain current than transistor T24. This causes the voltage at another complementary output node 155 to be pulled low via transistor T23. At the same time, due to the current mirror effect of transistors T15 and T16 in circuit 140, the current through transistor T15 is larger than the current through transistor T24, and therefore the OUT voltage is pulled high.

On the other hand, when INB>INA, transistor T20 conducts more current than transistor T21, the drain current of transistor T25 is larger than the drain current of transistor T22, and the drain current of transistor T18 is larger than the drain current of transistor T17. Thus, in this case, the voltage at the drain of transistor T20 is pulled lower than the voltage at the drain of transistor T21, and transistor T24 has a larger drain current than transistor T23. Since transistor T24 also conducts more current than transistor T15 in circuit 140, under these conditions OUT is pulled low via transistor T24.

In view of the above-described operation of input buffer circuit 100, if the common mode component of INA and INB is high and either INA>>INB or INB>>INA (i.e., the difference between INA and INB is at or near the maximum voltage swing of 350 mV), the effect of amplifier circuit 110 is sufficient to provide the appropriate low or high CMOS logic level for OUT. On the other hand, if the common mode component of INA and INB is low and either INA>>INB or INB>>INA, the effect of amplifier circuit 150 is sufficient to provide the appropriate low or high CMOS logic level for OUT. Where the input common mode voltage is in a middle region of the operating range, the combined effect of differential amplifiers 110 and 150 generates the appropriate CMOS logic level for OUT when either INA>>INB or INB>>INA.

The operation of input buffer 100 described above assumes that the IE signal is high and the input buffer circuit enabled. If the IE signal is low, the switch circuits formed by transistors Ten1 through Ten8 act to place input buffer 100 in a disabled mode. More particularly, when IE goes low, transistor Ten1 turns on and pulls the voltage at the drain of transistor T8 high. Another enabling transistor switch circuit (not shown) could also be used to pull the voltage at the drain of transistor T7 high in this case. Since /IE is high, transistors Ten2 and Ten3 also turn on pulling down the voltage at the gate of transistor T11 and at node 125 respectively—thus shutting off current mirror circuits 120 and 130. Since transistor Ten4 is also cut off when IE is low, current source circuit 160 is disabled and no substantial current is output at node 190. In addition, when IE goes low, transistor Ten5 turns off, blocking any bias current to differential amplifier 150. Transistors Te6 and Ten7 also turn on, pulling down the voltages at the drain terminals of T20 and T21 respectively. Furthermore, transistor Ten8 turns on when input buffer 100 is disabled, pulling up the OUT node to VCC, and therefore forcing the output of inverter G2 low. Lastly, when IE is low, transmission gate circuit 170 is also disabled so that the OUT' node is placed in a high impedance state.

Like other LVDS input buffer circuits, input buffer 100 does not respond well to and may not properly receive input signals that exceed the upper limit of the LVDS input operating range, typically+2.4 V. In accordance with an embodiment of the present invention, an LVDS input buffer circuit, such as circuit 100 described above, is adapted to support other differential I/O standards that have input signal voltages that may lie above the LVDS input operating range. In this embodiment, the input buffer circuit is especially suitable for receiving, in addition to LVDS input signals, CML (current mode logic) and PCML (pseudo current mode logic) input signals. CML and PCML are low power, high speed digital circuit standards that may be implemented using either bipolar or FET technology. Like LVDS, these standards also offer good noise performance due to their ability to reject common-mode signals. CML and PCML input signals may swing, for example, from about 2.7–3.3 V when VCC=3.3 V.

Figure 2:
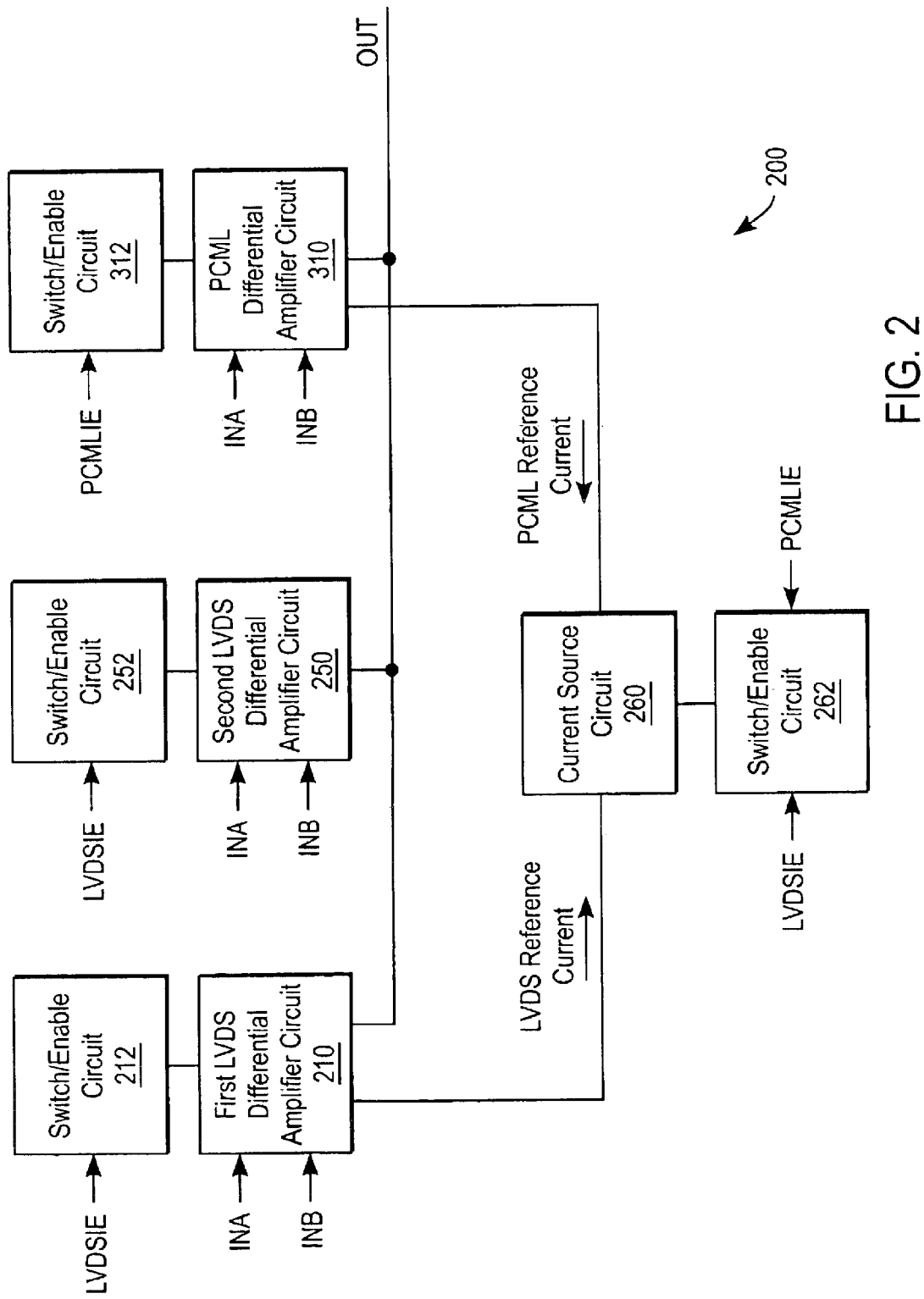
FIG. 2 is a block diagram of an input buffer circuit that supports multiple differential I/O standards in accordance with an embodiment of the present invention.

FIG. 2 is a high-level block diagram of an input buffer circuit 200 that supports multiple differential I/O standards in accordance with an embodiment of the present invention. In the illustrated embodiment, the two differential standards are LVDS and PCML. Input buffer 200 includes a first LVDS differential amplifier circuit 210, a second LVDS differential amplifier circuit 250, a PCML differential circuit 310, and a current source circuit 260. Each of circuits 210, 250, 310, and 260, has at least one associated switch enable circuit 212, 252, 312, and 262 respectively for selectively enabling that circuit depending on the mode of operation. Each differential amplifier circuit 210, 250, and 310 receives a differential input signal between the first input line signal INA and the second input line signal INB. The mode of operation is determined by the level of an LVDSIE control signal and a PCMLIE control signal. Current source circuit 260 which generates a reference current for first LVDS differential amplifier circuit 210 or for PCML differential circuit 310, depending on the mode of operation.

Figure 3A:
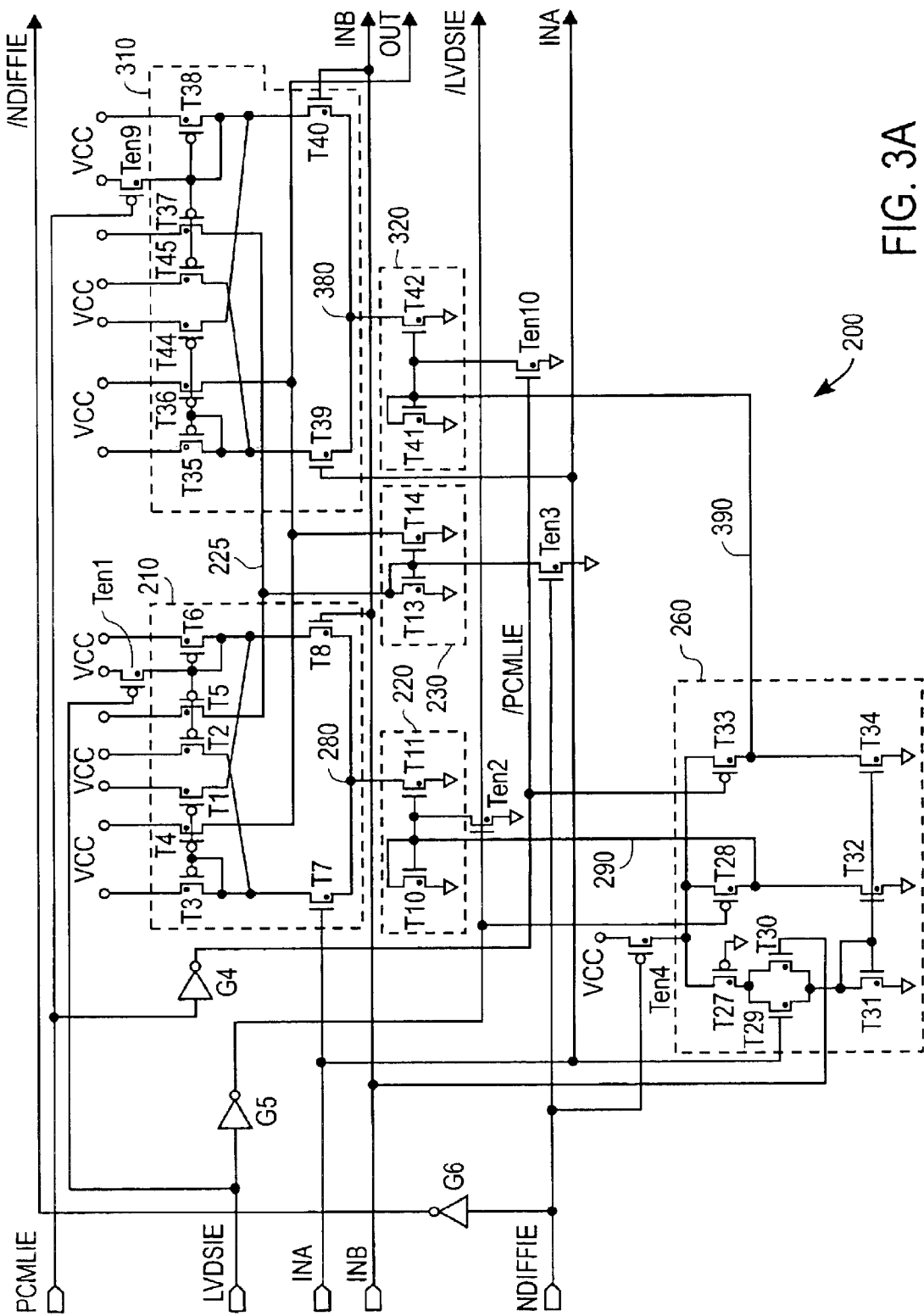
FIGS. 3A and 3B are circuit diagrams of the input buffer of FIG. 2 adapted from the LVDS input buffer circuit of FIG. 1.
Figure 3B:
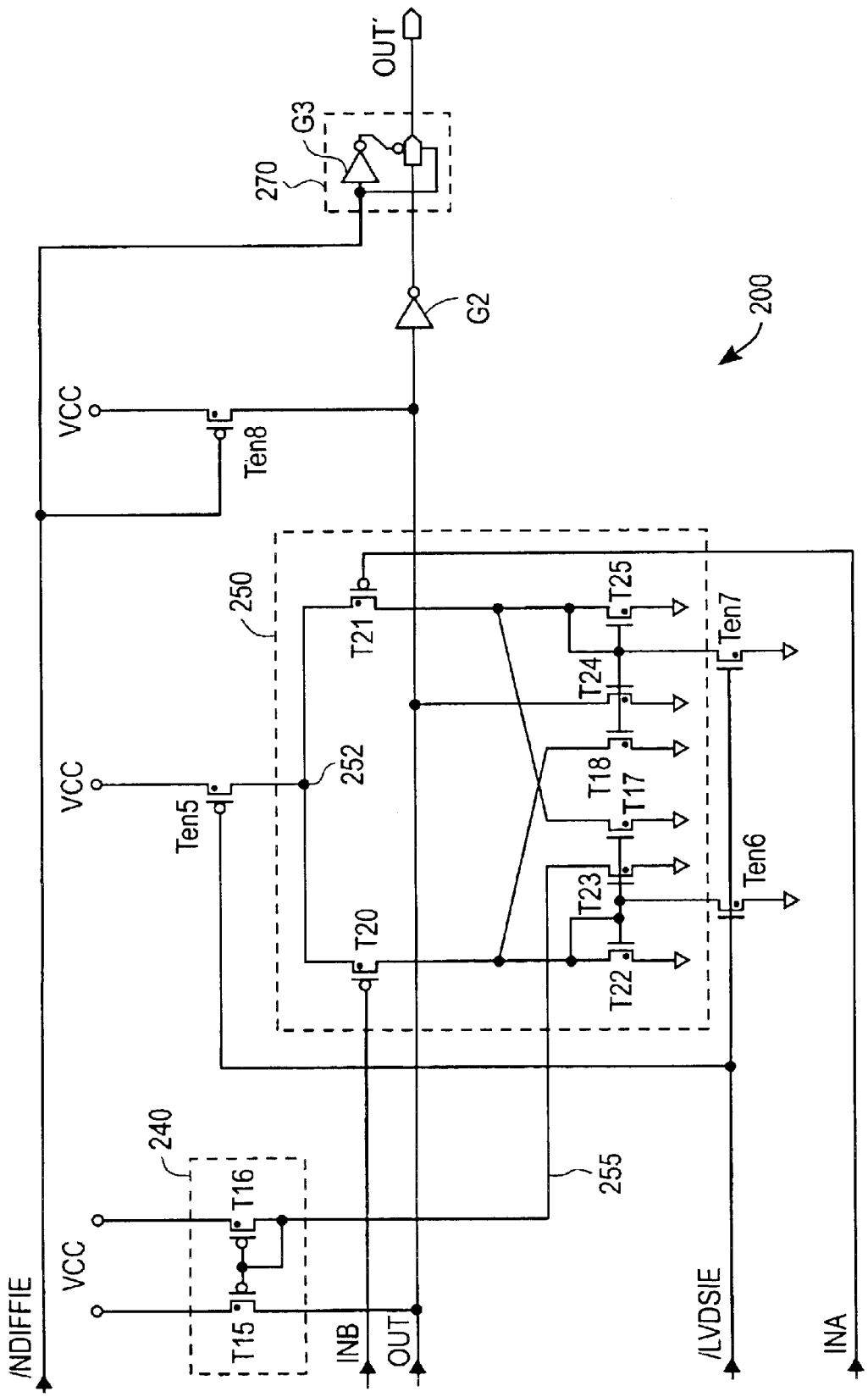

FIGS. 3A and 3B are circuit diagrams that together show an embodiment of input buffer circuit 200 in accordance with the present invention. In this illustrated embodiment, input buffer 200 is adapted from the LVDS buffer of FIG. 1 and again supports both LVDS and PCML input signals. As shown in FIGS. 3A and 3B, in addition to first LVDS differential amplifier circuit 210, second LVDS differential amplifier circuit 250, third PCML differential amplifier circuit 310, and current source circuit 260, input buffer 200 also includes a current mirror biasing circuit 220, a pull-down current mirror circuit 230, a pull-up current mirror circuit 240, a current mirror biasing circuit 320, and a transmission gate circuit 270. As indicated, input buffer 200 receives a differential input signal between a first input line signal INA and a second input line signal INB. A differential impedance of 100 (not shown) may be connected between the differential inputs of the receiver to sink DC current in the received signal. In this embodiment, the INA and INB signals are provided to first differential amplifier circuit 210, second differential amplifier circuit 250, third differential amplifier circuit 310, and current source circuit 260.

Input buffer circuit 200 also receives at least one, and preferably at least two, enable/control signals. In the illustrated embodiment, buffer 200 receives the LVDS input enable signal LVDSIE. LVDSIE is high when buffer 200 receives an LVDS input signal (i.e., LVDS mode) to control appropriate switch circuits to enable LVDS amplifiers 210 and 250 and related bias circuit 220. Similarly, buffer 200 receives the PCML input enable signal PCMLIE that is high when the buffer receives a PCML input signal (i.e., PCML mode) to control appropriate switch circuits to enable PCML amplifier 310 and related bias circuit 320. As will be appreciated, only one of the LVDSIE and PCMLIE signals may be set high at a time. As shown, a third global enable signal NDIFFIE may also used in input buffer 200. The NDIFFIE signal is high, indicating that buffer 200 is disabled for all differential inputs, when both the LVDSIE and PCMLIE signals are low. Where LVDSIE and PCMLIE are provided as independent signals, the NDIFFIE signal may be conveniently obtained by NOR'ing those signals together. Alternatively, a single input selection control signal may be provided to select between the LVDS and PCML input modes, i.e., LVDSIE is /PCMLIE. In this case the NDIFFIE signal can be independently provided (like IE in circuit 100). As shown in FIGS. 3A and 3B, the PCMLIE signal is inverted at a gate G4 to provide /PCMLIE, the LVDSIE signal is inverted at a gate G5 to provide /LVDSIE, and the NDIFFIE signal is inverted at a gate G6 to provide /NDIFFIE. The LVDSIE, PCMLIE, and NDIFFIE signals and their complements are provided to switch circuits to selectively enable/disable the various circuits in buffer 200. As in buffer 100, in the illustrated embodiment the switch circuits in input buffer 200 are generally formed by enabling transistors Ten1 through Ten10.

The structure of first amplifier circuit 210, biasing circuit 220, pull-down circuit 230, pull-up circuit 240, second amplifier circuit 250, and transmission gate circuit 270 are the same as that described above for circuits 110, 120, 130, 140, 150, and 170 respectively in buffer circuit 100. The nodes labeled 225 and 255 in buffer circuit 200 correspond to output node 125 and complementary output node 155 respectively in circuit 100. Also, similar to circuit 160 in circuit 100, current source circuit 260 has a first output 290 that provides a reference current that is converted, by mirror circuit 220, into an appropriate sink current at node 280 in amplifier 210. However, current source circuit 260 additionally has a second output 390 that provides a reference current that is converted, by mirror circuit 320 into an appropriate sink current at node 380 in amplifier 310.

Referring to FIG. 3A, PCML differential amplifier circuit 310 includes a differential pair of matched NMOS transistors T39 and T40 with an active current mirror load circuit formed by PMOS transistors T35, T36, T37, T38, T44, and T45. The gate of transistor T39 receives the INA input signal, and the gate of transistor T40 receives the INB input signal. Transistors T39 and T40 may have thick oxide layers, like the other transistors that receive the INA and INB signals. The source terminals of transistors T44, T45, T35, T36, T37, and T38 are each connected to the I/O power supply voltage VCC. The gate terminals of transistors T44, T35, and T36 are each connected to the drain terminal of transistor T39, while the gate terminals of transistors T45, T37, and T38 are each connected to the drain of transistor T40. The drain terminals of transistors T45 and T35 are also connected to the drain terminal of transistor T39, and the drain terminals of transistors T44 and T38 are connected to the drain of transistor T40. The drain of transistor T36 is connected to the OUT node as shown, and the drain of transistor T37 is connected to node 225. A switch circuit formed by PMOS transistor Ten9 is used to enable circuit 310. Transistor Ten9 receives the PCMLIE signal at its gate, while the source of Ten9 is connected to VCC and the drain of Ten9 is connected to the drain of transistor T40.

The source terminals of differential transistors T39 and T40 in circuit 310 are connected together at node 380 which is biased by current mirror circuit 320. Biasing circuit 320 includes two NMOS transistors T41 and T42 which have their sources connected to the receiver ground. The drain of transistor T42 in circuit 120 is connected to node 380, while the gates of both transistors T41 and T42 are connected to the drain of transistor T41 and also to the output 390 of current source circuit 260. The switch circuit formed by NMOS transistor Ten10 is used to enable biasing circuit 320, and so together with transistor T42 effectively enables amplifier 310 as well. Transistor Ten10 has its source connected to receiver ground and its drain connected to the gates of T41 and T42. The gate terminal of transistor Ten10 receives the inverted enable signal /PCMLIE.

Current source circuit 260 includes transistors T27, T28, T29, T30, T31, T32, T33, and T34. In current source 260, transistors T27, T28, T29, T30, T31, and T32 are connected in the same manner as the identically labeled transistors in current source 160 of buffer 100, except that the gate of PMOS transistor T28 in circuit 260 is connected to the /LVDSIE signal instead of being tied to receiver ground. Thus the current sourced by transistor T28 into output 290 is now cut off when LVDSIE is low. Like transistor T28, the source of PMOS transistor T33 is connected to the drain of transistor Ten4, which acts as an enable switch circuit for the entire current source 260. The gate of transistor T33 receives the /PCMLIE signal, and the drain of T33 is connected to output node 390. The source of NMOS transistor T34 is connected to receiver ground, and its drain to node 390. Since the gate of transistor T34 is connected to the gate of transistor T31, transistors T34 and T31 form a current mirror, similar to transistors T32 and T31.

In LVDS mode, LVDSIE is high, PCMLIE is low, and NDIFFIE is high. Since LVDSIE is high, enabling transistors Ten1 and Ten2 are off and therefore differential amplifier circuit 210 and bias circuit 220 are enabled. Similarly, since NDIFFIE is high, transistor Ten3 is off and pull-down circuit 230 is also enabled. Differential amplifier circuit 250 is operational as well with transistor Ten5 on and transistors Ten6 and Ten7 off in response to /LVDSIE. Transistors Ten4 and T28 in current source 260 are on, so that a reference current is output at node 290. Transmission gate circuit 270 is also enabled and transistor Ten8 is off, and the buffer output OUT provides the corresponding logic level for the LVDS input. Since transistors Ten9 and Ten10 are each turned on by PCMLIE and /PCMLIE respectively, the drain of transistor T40 in amplifier circuit 310 is pulled high, and transistor T42 in bias circuit 320 is shut off. Also, since transistor T33 in circuit 260 is off in response to the high /PCMLIE signal, no substantial current flows out of node 390. Since no current is provided to amplifier 310 at node 380, transistors T36 and T37 do not conduct any current to the current mirror load, and therefore circuit 310 is effectively isolated from and has no effect on the voltages at the OUT node and complementary output node 225. Thus, the inclusion of circuits 310 and 320 and the addition of transistors T33 and T34 in current source 260 do not affect LVDS operation, and the operation of buffer circuit 200 in LVDS mode is essentially the same as the operation of input buffer 100.

In PCML mode, LVDSIE is low, PCMLIE is high, and NDIFFIE is high. In this case, LVDS amplifier 210, LVDS amplifier 250, and bias circuit 220 are all disabled by the low LVDSIE signal. Since transistor T28 in circuit 260 is also cut off, no substantial current flows out of node 290. No bias current is provided to amplifier 210 or amplifier 250, and therefore neither transistors T4 and T5 in circuit 201 nor transistors T23 and T24 in circuit 350 have any effect on the OUT node or node 225. Thus, in this mode, both differential amplifier circuits 210 and 250 are isolated from and have little or no effect on the OUT node and node 225. Shutting off the LVDS amplifiers 210 and 250 in PCML mode also minimizes power consumption. With the PCMLIE signal high, amplifier circuit 310 and bias circuit 320 are enabled. Since the global enable signal NDIFFIE remains high, pull-down circuit 230 and transmission gate circuit 270 are still enabled, and transistor Ten8 remains off. In addition, because transistor T33 is on, current source circuit 260 generates a PCML reference current out of node 390.

Like the LVDS reference current, the magnitude of the PCML reference current is determined by the conductivity of the transistors in current source circuit 260, in particular transistors T29, T30, T31, T33, and T34. Furthermore, in PCML mode, INA and INB are higher than they are in LVDS mode and so transistors T29 and T30 conduct more current than in LVDS mode. As a result, transistor T34 generally has a larger drain current in PCML mode than transistor T32 in LVDS mode (assuming T32 and T34 are matched), and therefore the PCML reference current will generally be lower than the minimum LVDS reference at the upper limit of the LVDS input operating range. Providing a smaller bias current to PCML differential amplifier 310 helps ensure that transistors T39 and T40 remain sensitive to and able to properly amplify small input voltage swings with INA and INB near the VCC voltage level. Thus, when buffer 200 operates in PCML mode, OUT' is provided at the appropriate logic level state for a PCML input that typically swings above the LVDS input operating region.

When the global enable signal NDIFFIE is low, both LVDSIE and PCMLIE are also low and all of the circuits in input buffer 200 are effectively disabled, including transmission gate circuit 270. Thus, similar to the effect of a low IE signal in buffer circuit 100, in this mode, OUT' is placed in a high impedance state. In one embodiment, the enable/control signals LVDSIE, PCMLIE, and NDIFFIE are programmable settings in a programmable logic device, i.e., a standardized IC device that can be customized to perform desired functions. In this manner, a desired mode of operation for input buffer circuit 200—i.e., a LVDS enabled mode, a PCML enabled mode, or a global disabled mode—is readily and easily set.

As indicated, the conductivity of differential pair transistors T39 and T40 in differential amplifier circuit 310 may be selected to best support the input operating range of a particular differential I/O standard. In one embodiment, the width of transistors T39 and T40 is selected to have a value within a certain design range for this purpose.

The above-described embodiment of the present invention provides considerable flexibility in interfacing digital devices by allowing an LVDS input buffer circuit to be readily adapted to be fully compatible with I/O signals for other differential I/O standards. Furthermore, even for other I/O standards, input buffer circuit 200 continues to use a substantial part of the original LVDS input buffer circuitry, avoiding unnecessary duplication of circuit functions. More generally, the principles of the present invention can be applied to provide an input buffer having a plurality of selectively enabled differential amplifier circuits, where each differential amplifier is designed for compatibility with a particular differential I/O standard and its corresponding input operating range. If the input operating range for an I/O standard is large—as is the case for LVDS and LVPECL—two or more differential amplifiers can be used to provide amplification in different portions of the input operating range, similar to amplifiers 210 and 250 in circuit 200. By selectively enabling, preferably programmably, only the differential amplifier circuit(s) designed for a specific input signal standard, the input buffer of the present invention can provide still further flexibility in interfacing digital devices using a variety of differential I/O standards.

While the invention has been described in conjunction with specific embodiments, it is evident that numerous alternatives, modifications, and variations will be apparent to those skilled in the art in light of the foregoing description.

What is claimed is:

1. An input buffer circuit comprising:

first and second differential input terminals for receiving first and second input signals respectively, the difference between the input signals providing a differential input signal;

a first differential amplifier circuit having a first input coupled to the first differential input terminal and a second input coupled to the second differential input terminal, the first differential amplifier circuit being configured to generate a first logic level signal at an output node when the differential input signal is provided in accordance with a first digital I/O standard, wherein the first digital I/O standard has an input operating range and the first differential amplifier circuit is configured to generate the first logic level signal at the output node when the differential input is provided in accordance with the first digital I/O standard and a common mode component of the input signals is in a first portion of the input operating range;

a second differential amplifier circuit having a first input coupled to the first differential input terminal and a second input coupled to the second differential input terminal, the second differential amplifier circuit being configured to generate a second logic level signal at the output node when the differential input is provided in accordance with a second digital I/O standard;

a first set of one or more switch circuits coupled to the first differential amplifier circuit, the first set of switch circuits selectively enabling the first differential amplifier circuit in a first input buffer mode;

a second set of one or more switch circuits coupled to the second differential amplifier circuit, the second set of switch circuits selectively enabling the second differential amplifier circuit in a second input buffer mode;

a third differential amplifier circuit having a first input coupled to the first differential input terminal and a second input coupled to the second differential input terminal, the third differential amplifier circuit being configured to generate the first logic level signal at the output node when the differential input is provided in accordance with the first digital I/O standard and the common mode component of the input signals is in a second portion of the input operating range; and a third set of one or more switch circuits coupled to the third differential amplifier circuit, the third set of switch circuits selectively enabling the third differential amplifier circuit in the first input buffer mode.

2. The input buffer circuit of claim 1 wherein the second digital I/O standard has an input operating range that extends above the input operating range of the first digital I/O standard.

3. The input buffer circuit of claim 2 wherein the first digital I/O standard is Low Voltage Differential Signaling.

4. The input buffer circuit of claim 3 wherein the second I/O standard is one of: current mode logic and pseudo current mode logic.

5. An input buffer circuit comprising:

first and second differential input terminals for receiving first and second input signals respectively, the difference between the input signals providing a differential input signal;

a first differential amplifier circuit having a first input coupled to the first differential input terminal and a second input coupled to the second differential input terminal, the first differential amplifier circuit being configured to generate a first logic level signal at an output node when the differential input signal is provided in accordance with a first digital I/O standard;

a second differential amplifier circuit having a first input coupled to the first differential input terminal and a second input coupled to the second differential input terminal, the second differential amplifier circuit being configured to generate a second logic level signal at the output node when the differential input is provided in accordance with a second digital I/O standards each of the first and second differential amplifier circuits comprising:
- a first input transistor having a first terminal coupled to a biasing node, a second terminal, and a control terminal coupled to the first differential input terminal;
- a second input transistor having a first terminal coupled to the biasing node, a second terminal, and a control terminal coupled to the second differential input terminal; and
- a load circuit comprising
  - a first current mirror circuit having a first terminal coupled to the second terminal of the first input transistor and a second terminal coupled to the output node, wherein the current at the first and second terminals of the first current mirror circuit are proportional to one another; and
  - a second current mirror circuit having a first terminal coupled to the second terminal of the second input transistor and a second terminal coupled to a complementary output node, wherein the current at the first and second terminals of the second current mirror circuit are proportional to one another;

a first set of one or more switch circuits coupled to the first differential amplifier circuit, the first set of switch circuits selectively enabling the first differential amplifier circuit in a first input buffer mode; and a second set of one or more switch circuits coupled to the second differential amplifier circuit, the second set of switch circuits selectively enabling the second differential amplifier circuit in a second input buffer mode.

6. The input buffer circuit of claim 5 wherein the load circuit in each of the first and second differential amplifier circuits further comprises:
- a third current mirror circuit having a first terminal coupled to the second terminal of the first input transistor and a second terminal coupled to the second terminal of the second input transistor, wherein the current at the second terminal of the third current mirror is proportionally larger than the current at the first terminal of the third current mirror; and
- a fourth current mirror circuit having a first terminal coupled to the second terminal of the second input transistor and a second terminal coupled to the second terminal of the first input transistor, wherein the current at the second terminal of the fourth current mirror is proportionally larger than the current at the first terminal of the fourth current mirror.

7. The input buffer circuit of claim 6 wherein, in each load circuit the first current mirror comprises
- a first load transistor having a first terminal coupled to a supply signal node, a second terminal coupled to the second terminal of the first input transistor, and a control terminal coupled to the second terminal of the first input transistor, wherein the second terminal of the first load transistor provides the first terminal of the first current mirror, and
- a second load transistor having a first terminal coupled to the supply signal node, a second terminal coupled to the output node, and a control terminal coupled to the second terminal of the first input transistor, wherein the second terminal of the second load transistor provides the second terminal of the first current mirror;

the second current mirror comprises
- a third load transistor having a first terminal coupled to the supply signal node, a second terminal coupled to the second terminal of the second input transistor, and a control terminal coupled to the second terminal of the second input transistor, wherein the second terminal of the third load transistor provides the first terminal of the second current mirror, and
- a fourth load transistor having a first terminal coupled to the supply signal node, a second terminal coupled to the complementary output node, and a control terminal coupled to the second terminal of the second input transistor, wherein the second terminal of the fourth load transistor provides the second terminal of the second current mirror;

the third current mirror comprises
- the first load transistor, wherein the second terminal of the first load transistor provides the first terminal of the third current mirror, and
- a fifth load transistor having a first terminal coupled to the supply signal node, a second terminal coupled to the second terminal of the second input transistor, and a control terminal coupled to the second terminal of the first input transistor, wherein the second terminal of the fifth load transistor provides the second terminal of the third current mirror; and the fourth current mirror comprises
- the third load transistor, wherein the second terminal of the third load transistor provides the first terminal of the fourth current mirror, and
- a sixth load transistor having a first terminal coupled to the supply signal node, a second terminal coupled to the second terminal of the first input transistor, and a control terminal coupled to the second terminal of the second input transistor, wherein the second terminal of the sixth load transistor provides the second terminal of the fourth current mirror.

8. The input buffer circuit of claim 7 wherein, in each of the first and second differential amplifier circuits, each input transistor is an NMOS transistor and each load transistor is a PMOS transistor, and wherein, for each input and each load transistor, the first terminal is a source terminal, the second terminal is a drain terminal, and the control terminal is a gate terminal.

9. The input buffer circuit of claim 5 further comprising:
- a current source circuit having a first output that provides a first reference current to bias the biasing node of the first differential amplifier when the first differential amplifier is enabled and a second output that provides a second reference current to bias the biasing node of the second differential amplifier when the second differential amplifier is enabled.

10. The input buffer circuit of claim 9 wherein the current source circuit has a first input coupled to the first differential input terminal and a second input coupled to the second differential input terminal, and, when a common mode component of the differential input signal is above a threshold level, the current source circuit lowers the magnitude of the reference current provided to the enabled differential circuit as the common mode component of the differential input signal increases.

11. The input buffer circuit of claim 10 wherein the current source circuit comprises:
    a first source input transistor having a first terminal coupled to a first current source node, a second terminal coupled to a second current source node, and a control terminal coupled to the first differential input terminal;
    a second source input transistor having a first terminal coupled to the first current source node, a second terminal coupled to the second current source node, and a control terminal coupled to the second differential input terminal;
    a first current source coupled between a supply signal node and the first output of the current source circuit, the first current source providing current into said first output only when the first differential amplifier circuit is enabled;
    a second current source coupled between the supply signal node and the second output of the current source circuit, the second current source providing current into said second output only when the second differential amplifier circuit is enabled;
    a first source current mirror circuit having a first terminal coupled to the first current source node and a second terminal coupled to the first output of the current source circuit, wherein the current at the first and second terminals of the first source current mirror circuit are proportional to one another; and
    a second source current mirror circuit having a first terminal coupled to the first current source node and a second terminal coupled to the second output of the current source circuit, wherein the current at the first and second terminals of the second source current mirror circuit are proportional to one another.

12. The input buffer circuit of claim 9 further comprising:
    a first bias current mirror circuit having a first terminal coupled to the first output of the current source circuit and a second terminal coupled to the biasing node of the first differential amplifier, wherein the currents at the first and second terminals of the first bias current mirror circuit are proportional to one another; and
    a second bias current mirror circuit having a first terminal coupled to the second output of the current source circuit and a second terminal coupled to the biasing node of the second differential amplifier, wherein the currents at the first and second terminals of the second bias current mirror circuit are proportional to one another.

13. The input buffer circuit of claim 5 further comprising a pull-down current mirror circuit having a first terminal coupled to the complementary output node and a second terminal coupled to the output node, wherein the current at the first and second terminals of the pull-down current mirror circuit are proportional to one another.

14. An input buffer circuit comprising:
    a first differential amplifier circuit receiving a differential input signal between a first input and a second input thereof, the first differential amplifier circuit being enabled in a first input buffer mode to generate a first logic level signal at an output node when the differential input signal is provided in accordance with a first digital I/O standard;
    a second differential amplifier circuit receiving the differential input signal between a first input and a second input thereof, the second differential amplifier circuit being enabled in a second input buffer mode to generate a second logic level signal at the output node when the differential input signal is provided in accordance with a second digital I/O standard; and
    a third differential amplifier circuit receiving the differential input signal between a first input and a second input thereof, the third differential amplifier circuit being enabled in the first input buffer mode to generate the first logic level signal at the output node when the differential input signal is provided in accordance with the first digital I/O standard;
    wherein the first differential amplifier circuit provides greater amplification than the third differential amplifier circuit in a first portion of an input operating range for the first digital I/O standard, and the third differential amplifier circuit provides greater amplification than the first differential amplifier circuit in a second portion of the input operating range for the first digital I/O standard.

15. The input buffer of claim 14 further comprising:
    a first set of one or more switch circuits coupled to the first differential amplifier circuit, the first set of switch circuits selectively enabling the first differential amplifier circuit in the first input buffer mode and disabling the first differential amplifier in the second input buffer mode;
    a second set of one or more switch circuits coupled to the second differential amplifier circuit, the second set of switch circuits selectively enabling the second differential amplifier circuit in the second input buffer mode and disabling the second differential amplifier in the first input buffer mode; and
    a third set of one or more switch circuits coupled to the third differential amplifier circuit, the third set of switch circuits selectively enabling the third differential amplifier circuit in the first input buffer mode and disabling the first differential amplifier in the second input buffer mode.

16. The input buffer circuit of claim 15 wherein each switch circuit receives a programmable control signal for selectively enabling and disabling the associated differential amplifier circuit.

17. The input buffer of claim 14 wherein each of the first, second, and third differential amplifier circuits comprises:
    a first input transistor having a first terminal coupled to a biasing node, a second terminal, and a control terminal providing the first input of said differential amplifier;
    a second input transistor having a first terminal coupled to the biasing node, a second terminal, and a control terminal providing the second input of said differential amplifier; and a load circuit comprising
    a first current mirror circuit having a first terminal coupled to the second terminal of the first input transistor and a second terminal coupled to the output node, wherein the currents at the first and second terminals of the first current mirror circuit are proportional to one another, a second current mirror circuit having a first terminal coupled to the second terminal of the second input transistor and a second terminal, the current at the first and second terminals of the second current mirror circuit being proportional to one another, and wherein in the first and second differential amplifier circuits the second terminal of the second current mirror is coupled to a first complementary output node, and in the third differential amplifier circuit the second terminal of the second current mirror is coupled to a second complementary output node.

18. The input buffer circuit of claim 17 wherein the load circuit in each of the first, second, and third differential amplifier circuits further comprises:

a third current mirror having a first terminal coupled to the second terminal of the first input transistor and a second terminal coupled to the second terminal of the second input transistor, wherein the current at the second terminal of the third current mirror is proportionally larger than the current at the first terminal of the third current mirror; and a fourth current mirror having a first terminal coupled to the second terminal of the second input transistor and a second terminal coupled to the second terminal of the first input transistor, wherein the current at the second terminal of the fourth current mirror is proportionally larger than the current at the first terminal of the fourth current mirror.

19. The input buffer circuit of claim 18 wherein:

in each of the first and second differential amplifier circuits, each input transistor is an NMOS transistor and the current mirror circuits comprise PMOS transistors; and in the third differential amplifier circuit, each input transistor is a PMOS transistor and the current mirror circuits comprise NMOS transistors; and for each input transistor, the first terminal is a source terminal, the second terminal is a drain terminal, and the control terminal is a gate terminal.

20. The input buffer circuit of claim 18 further comprising:

a pull-down current mirror circuit having a first terminal coupled to the first complementary output node and a second terminal coupled to the output node, wherein the current at the first and second terminals of the pull-down current mirror circuit are proportional to one another; and a pull-up current mirror circuit having a first terminal coupled to the second complementary output node and a second terminal coupled to the output node, wherein the currents at the first and second terminals of the pull-up current mirror circuit are proportional to one another.

21. The input buffer circuit of claim 20 wherein the second digital I/O standard has an input operating range that extends above the input operating range of the first digital I/O standard.

22. The input buffer circuit of claim 21 wherein the first digital I/O standard is Low Voltage Differential Signaling and the second I/O standard is one of: current mode logic and pseudo current mode logic.

23. The input buffer circuit of claim 21 wherein each of the first and second input transistors in the first differential amplifier circuit has a lower conductivity than the first and second input transistors in the second differential amplifier circuit.

24. The input buffer circuit of claim 23 wherein the first current source circuit receives a differential input signal between a first input and a second input thereof and, when a common mode component of the differential input signal is above a threshold level, the first current source circuit lowers the magnitude of the reference current provided to the enabled differential circuit as the common mode component of the differential input signal increases.

25. The input buffer circuit of claim 17 further comprising:

a first current source circuit having a first output that provides a first reference current to bias the biasing node of the first differential amplifier when the first differential amplifier is enabled and a second output that provides a second reference current to bias the biasing node of the second differential amplifier when the second differential amplifier is enabled; and a second current source circuit having an output that provides a current to bias the biasing node of the third differential amplifier when the third differential amplifier is enabled.

* * * * *